(12) United States Patent
Sung et al.

(10) Patent No.: US 11,205,593 B2
(45) Date of Patent: Dec. 21, 2021

(54) ASYMMETRIC FIN TRIMMING FOR FINS OF FINFET DEVICE

(71) Applicant: Applied Materials, Inc., Santa Clara, CA (US)

(72) Inventors: Min Gyu Sung, Essex, MA (US); Johannes M. van Meer, Middleton, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/879,134

(22) Filed: May 20, 2020

(65) Prior Publication Data

US 2021/0366776 A1    Nov. 25, 2021

(51) Int. Cl.
    *H01L 21/3065*    (2006.01)
    *H01L 21/8234*    (2006.01)
    *H01L 21/3115*    (2006.01)
    *H01L 21/311*     (2006.01)

(52) U.S. Cl.
CPC .......... *H01L 21/823431* (2013.01); *H01L 21/31116* (2013.01); *H01L 21/31155* (2013.01); *H01L 21/823481* (2013.01)

(58) Field of Classification Search
CPC .................................................. H01L 21/3065
See application file for complete search history.

(56) References Cited

U.S. PATENT DOCUMENTS

| | | | |
|---|---|---|---|
| 9,412,603 B2 | 8/2016 | Zhang et al. | |
| 9,620,407 B2 | 4/2017 | Godet et al. | |
| 9,865,710 B2 | 1/2018 | Liu | |
| 10,325,817 B2 | 6/2019 | Bi et al. | |
| 10,510,610 B2* | 12/2019 | Sung | H01L 29/66818 |
| 2006/0172497 A1* | 8/2006 | Hareland | H01L 29/66772 438/286 |
| 2016/0293737 A1 | 10/2016 | Liu | |
| 2017/0133491 A1* | 5/2017 | Ruffell | H01L 29/1054 |
| 2019/0304841 A1* | 10/2019 | Sung | H01L 21/823821 |
| 2020/0411513 A1* | 12/2020 | Jambunathan | H01L 21/823431 |

OTHER PUBLICATIONS

"Highly Manufacturable 7nm FinFET Technology featuring EUV lithography for Low Power and High Performance Applications," Daewon Ha et al., 2017 Symposium on VLSI Technology Digest of Technical Papers, 2 pages.

* cited by examiner

*Primary Examiner* — Thomas T Pham
(74) *Attorney, Agent, or Firm* — Kacvinsky Daisak Bluni PLLC

(57) ABSTRACT

Disclosed are approaches for forming finFET devices having asymmetric fins achieved via fin trimming. In some embodiments, a method may include providing a substrate within a process chamber, the substrate including a plurality of fins, and forming a capping layer over the plurality of fins, wherein the capping layer extends along a first sidewall and a second sidewall of each of the plurality of fins. The method may further include removing a portion of the capping layer to expose a target area of the first sidewall of each of the plurality of fins, and trimming the target area of the first sidewall of each of the plurality of fins to reduce a lateral width of an upper section of each of the plurality of fins.

14 Claims, 10 Drawing Sheets

ASYMMETRIC FIN TRIMMING FOR FINS OF FINFET DEVICE

FIELD OF THE DISCLOSURE

The present disclosure relates to semiconductor devices, and more particularly, to devices and methods of forming devices having asymmetric fins achieved via fin trimming.

BACKGROUND OF THE DISCLOSURE

A FinFET is a field effect transistor including a narrow, active area of a semiconductor material protruding from a substrate so as to resemble a fin. The fin includes source and drain regions. Active areas of the fin are separated by shallow trench isolation (STI), such as $SiO_2$. The FinFET also includes a gate region located between the source and the drain regions. The gate region is formed on a top surface and sidewalls of the fin so the gate region wraps around the fin. The portion of the fin extending under the gate between the source region and the drain region is the channel region.

One type of FinFET is fabricated on silicon on insulator (SOI) wafers. One advantage of SOI FinFETs the low leakage current from source to drain due to the oxide layer below the fin blocking the leakage current. Another type of FinFET is fabricated on conventional bulk silicon wafers. These FinFETs are known as bulk FinFETs. Fabricating FinFETs on conventional bulk Si wafers can be considered advantageous for two reasons: (i) the lower cost of bulk wafers; and (ii) the option to co-integrate conventional planar bulk FETs and FinFETs in a single product.

In FinFETs, the source and the drain region are heavily doped. The source and the drain regions have a first conductivity type (n-type for NMOS and p-type for PMOS). A problem with existing bulk FinFETs is the presence of a leakage path from source to drain through the part of the fin not controlled by the gate, i.e., the portion of the fin below the gate and adjacent to the STI. The leakage from source to drain through the lower part of the fin is known as punch-through leakage. Punch-through leakage causes an undesirable increase of static power consumption.

Therefore, there is a need for further methods of forming finFET devices resulting in reduced current leakage.

SUMMARY OF THE DISCLOSURE

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one approach, a method may include providing a substrate within a process chamber, the substrate including a plurality of fins, and forming a capping layer over the plurality of fins, wherein the capping layer extends along a first sidewall and a second sidewall of each of the plurality of fins. The method may further include removing a portion of the capping layer to expose a target area of the first sidewall of each of the plurality of fins, and trimming the target area of the first sidewall of each of the plurality of fins to reduce a lateral width of an upper section of each of the plurality of fins.

In another approach, an apparatus may include an ion source operable to deliver ions to a substrate including a plurality of fins. Each of the plurality of fins may include a lower section extending from a top surface of the substrate, and an upper section extending from the lower section, wherein a first width of the lower section is greater than a second width of the upper section, and wherein a first sidewall of the upper section is parallel to a second sidewall of the upper section.

In another approach, a method of forming a finFET device may include providing a plurality of fins extending from a substrate, and forming a capping layer over the plurality of fins and the substrate, wherein the capping layer extends along a first sidewall and a second sidewall of each of the plurality of fins. The method may further include removing a portion of the capping layer to expose a target area of the first sidewall of each of the plurality of fins, wherein the capping layer remains along the second sidewall of each of the plurality of fins, and reducing a lateral width of an upper section of each of the plurality of fins by trimming the target area of the first sidewall of each of the plurality of fins.

BRIEF DESCRIPTION OF THE DRAWINGS

By way of example, embodiments of the disclosure will now be described, with reference to the accompanying drawings, in which.

Figure 1A:
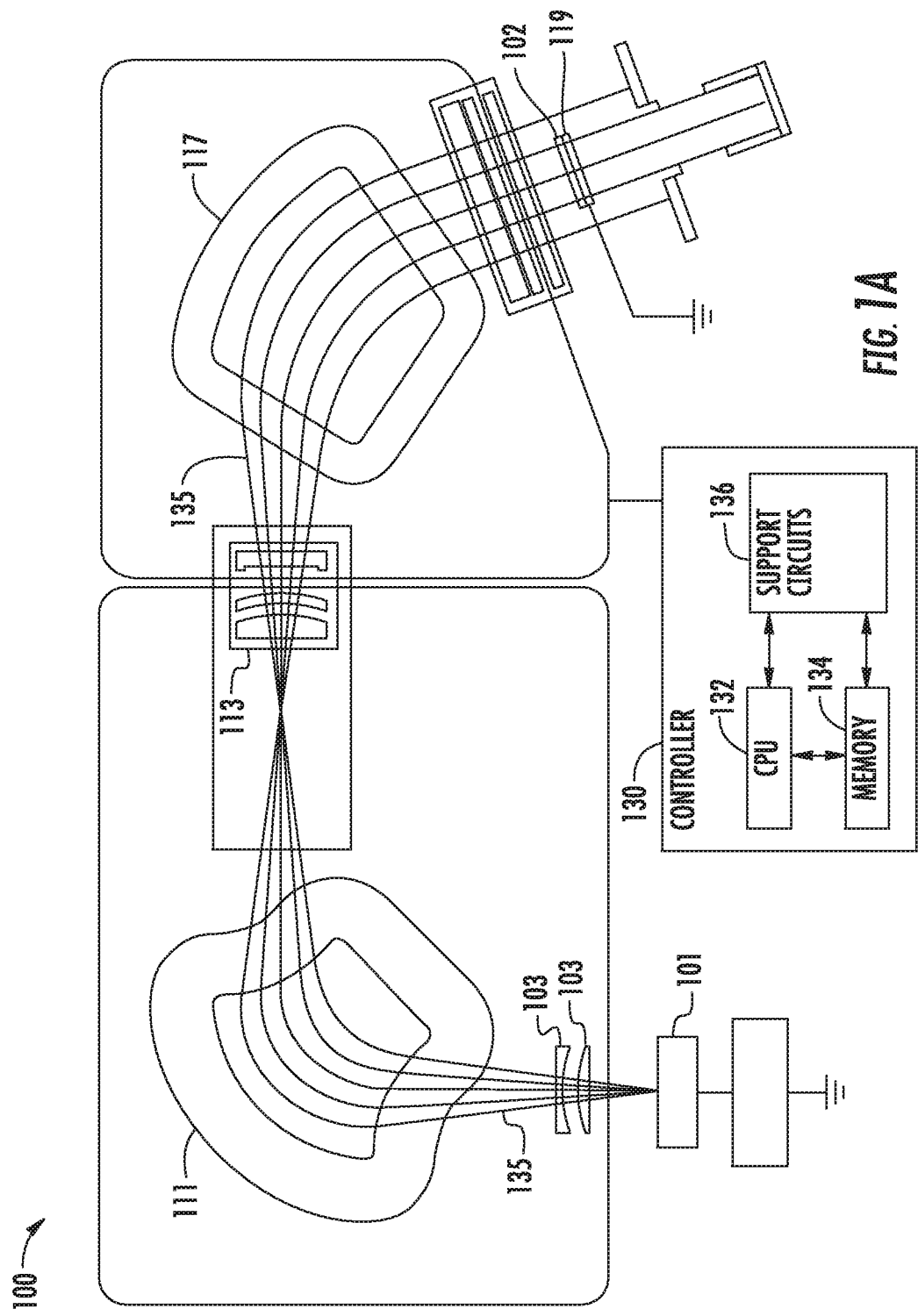
FIG. 1A illustrates a schematic diagram of an implantation apparatus according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain back-

DETAILED DESCRIPTION

Methods and devices in accordance with the present disclosure will now be described more fully hereinafter with reference to the accompanying drawings, where embodiments of the methods are shown. The methods and devices may be embodied in many different forms and are not to be construed as being limited to the embodiments set forth herein. Instead, these embodiments are provided so the disclosure will be thorough and complete, and will fully convey the scope of the system and method to those skilled in the art.

As described above, conventional bulk finFETs have a source to drain leakage path located underneath the active fin channel, which leads to poor drain induced barrier lowering (DIBL). One effective way to address this problem is to have a smaller fin width to minimize the leakage current and enhance electrical properties of the FinFET devices. To achieve thinner fin width profiles, a trimming process can be used to laterally etch the fins to reduce fin width. As will be described in greater detail herein, embodiments of the present disclosure provide an ideal shaped fin having a smaller active fin width and a greater body fin width. In some embodiments, asymmetrical lateral width fin trimming can be performed before source trench isolation (STI) formation, advantageously resulting in a narrower active fin profile and, thus, improved device performance.

FIG. 1A illustrates a schematic diagram of a processing apparatus 100 useful to perform processes described herein. One example of a beam-line ion implantation processing apparatus is the Varian VIISTA® Trident, available from Applied Materials Inc., Santa Clara, Calif. In addition to the apparatus 100 described below and the apparatus 100A described with regard to FIG. 1B, other ion implantation apparatuses, such as plasma immersion ion implantation apparatus or plasma assisted doping apparatus, may be used to perform the methods described herein.

The processing apparatus 100 may include an ion source 101 for generating ions. The processing apparatus 100 may also include a series of beam-line components. Examples of beam-line components may include extraction electrodes 103, a magnetic mass analyzer 111, a plurality of lenses 113, and a beam parallelizer 117. The processing apparatus 100 may also include a platen 119 for supporting a substrate 102 to be processed. The substrate 102 may be moved in one or more dimensions (e.g. translate, rotate, tilt, etc.) by a component sometimes referred to as a "roplat" (not shown). It is also contemplated that the processing apparatus 100 may be configured to perform heated implantation processes to provide for improved control of implantation characteristics, such as the ion trajectory and implantation energy utilized to dope the substrate.

In operation, ions of the desired species, for example, dopant ions, are generated and extracted from the ion source 101. Thereafter, the extracted ions 135 travel in a beam-like state along the beam-line components and may be implanted in the substrate 102. Similar to a series of optical lenses that manipulate a light beam, the beam-line components manipulate the extracted ions 135 along the ion beam. In such a manner, the extracted ions 135 are manipulated by the beam-line components while the extracted ions 135 are directed toward the substrate 102. It is contemplated that the apparatus 100 may provide for improved mass selection to implant desired ions while reducing the probability of undesirable ions (impurities) being implanted in the substrate 102.

In some embodiments, the processing apparatus 100 can be controlled by a processor-based system controller such a controller 130. For example, the controller 130 may be configured to control beam-line components and processing parameters associated with beam-line ion implantation processes. The controller 130 may include a programmable central processing unit (CPU) 132 that is operable with a memory 134 and a mass storage device, an input control unit, and a display unit (not shown), such as power supplies, clocks, cache, input/output (I/O) circuits, and the like, coupled to the various components of the processing apparatus 100 to facilitate control of the substrate processing. The controller 130 also includes hardware for monitoring substrate processing through sensors in the processing apparatus 100, including sensors monitoring the substrate position and sensors configured to receive feedback from and control a heating apparatus coupled to the processing apparatus 100. Other sensors that measure system parameters such as substrate temperature and the like, may also provide information to the controller 130.

To facilitate control of the processing apparatus 100 described above, the CPU 132 may be one of any form of general-purpose computer processor that can be used in an industrial setting, such as a programmable logic controller (PLC), for controlling various chambers and sub-processors. The memory 134 is coupled to the CPU 132 and the memory 134 is non-transitory and may be one or more of readily available memory such as random access memory (RAM), read only memory (ROM), floppy disk drive, hard disk, or any other form of digital storage, local or remote. Support circuits 136 may be coupled to the CPU 132 for supporting the processor in a conventional manner. Implantation and other processes are generally stored in the memory 134, typically as a software routine. The software routine may also be stored and/or executed by a second CPU (not shown) that is remotely located from the hardware being controlled by the CPU 132.

The memory 134 is in the form of computer-readable storage media that contains instructions, that when executed by the CPU 132, facilitates the operation of the apparatus 100. The instructions in the memory 134 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 1B:
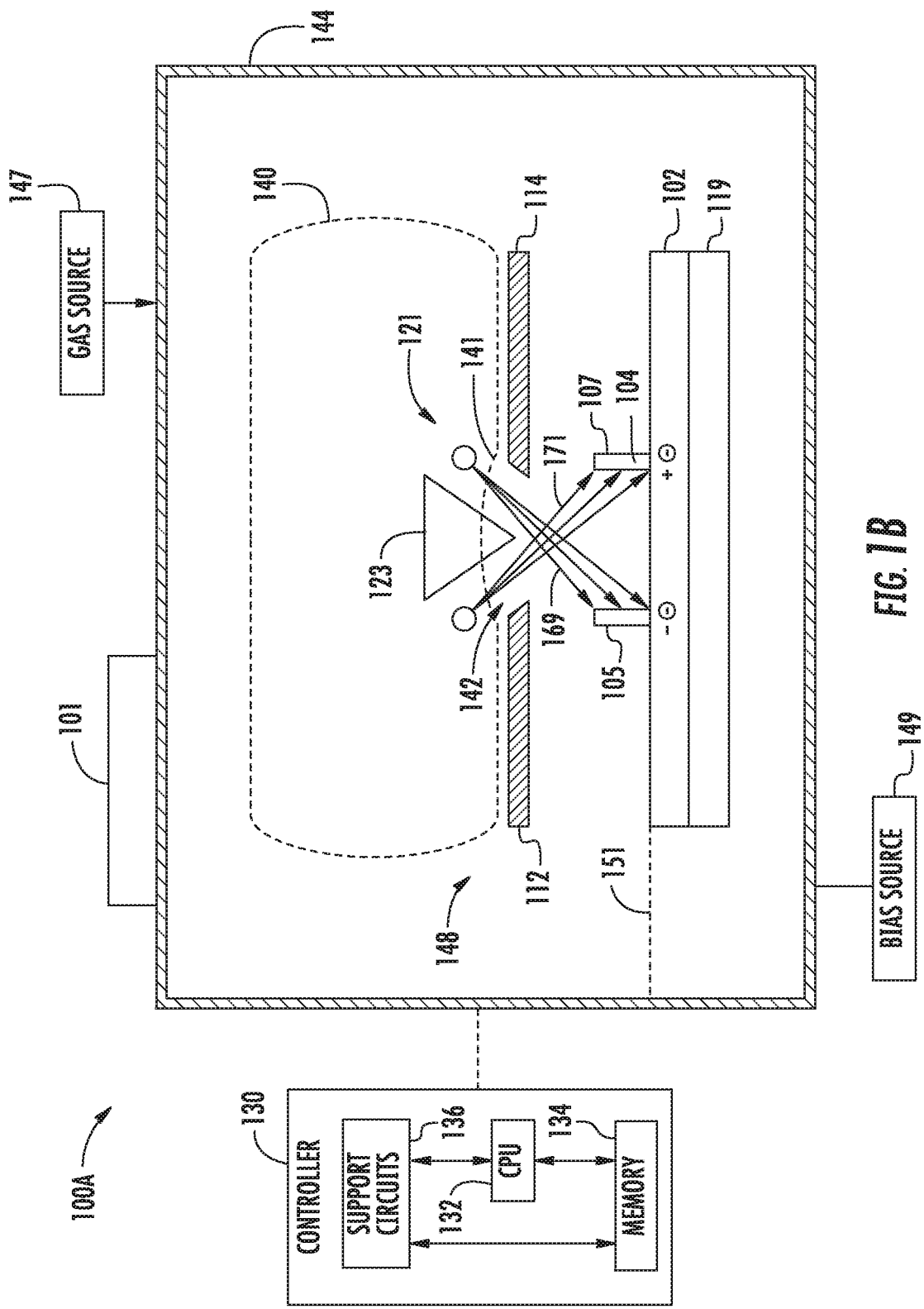
FIG. 1B illustrates a schematic diagram of an implantation apparatus according to embodiments of the present disclosure.

FIG. 1B illustrates a schematic diagram of another processing apparatus 100A useful to perform processes described herein. The plasma processing apparatus 100A is representative of a uni-directional or bi-directional plasma implantation apparatus, wherein the plasma processing apparatus 100A includes a process chamber 144, a platen 119, a source 101, and a modifying element 148. The platen 119 may be positioned in the processing chamber 144 for supporting the substrate 102. The platen 119 may be coupled to an actuator (not shown) which may cause the platen 119 to move in a scanning motion. The scanning motion may be a back and forth movement within a single plane which may be substantially parallel to the modifying element 148. The source 101 is configured to generate the plasma 140 in the process chamber 144. The modifying element 148 includes a pair of insulators 112, 114 which may define a gap therebetween having a horizontal spacing. The insulators 112, 114 may comprise an insulating material, a semiconducting material, or a conductive material. The modifying element 148 also includes a directional element 123 disposed in a position relative to the insulators 112, 114 to define a directional pathway for ions 121 delivered toward the substrate 102.

In operation, a gas source 147 may supply an ionizable gas to the process chamber 144. Examples of an ionizable gas may include $BF_3$, $BI_3$, $N_2$, Ar, $PH_3$, $AsH_3$, $B_2H_6$, $H_2$, Xe, Kr, Ne, He, $CHF_3$, $C_2F_6$, $CH_4$, $CF_4$, $CO_2$, $AsF_5$, Carborane, $PF_3$ and $PF_5$, among others. More specifically, species of ions may include He+, $H_3$+, $H_2$+, H+, Ne+, F+, C+, $CF_x$+, $CH_x$+, $C_xH_y$, N+, B+, $BF_2$+, $B_2H_x$+, Xe+ and molecular carbon, boron, or boron carbide ions. The source 101 may generate plasma 140 by exciting and ionizing the gas provided to the process chamber 144. The ions 121 are attracted from the plasma 140 across a plasma sheath 142. For example, a bias source 149 is configured to bias the substrate 102 to attract the ions 121 from the plasma 140 across the plasma sheath 142. The bias source 149 may be a DC power supply to provide a DC voltage bias signal or an RF power supply to provide an RF bias signal.

The modifying element 148 modifies the electric field within the plasma sheath 142 to control a shape of the boundary 141 between the plasma 140 and the plasma sheath 142. The modifying element 148 includes the insulators 112, 114 and directional element 123. The insulators 112, 114 and directional element 123 may be fabricated from materials such as quartz, alumina, boron nitride, glass, silicon nitride, silicon, silicon carbide, doped silicon, graphite, and other suitable materials. A boundary 141 between the plasma 140 and the plasma sheath 142 may be dependent upon the placement of the directional element 123 relative to the insulators 112, 114 as the directional element 123 may alter the electric field within the plasma sheath 142.

Ions following a trajectory path 171 may strike the substrate 102 at about an angle of +θ normal to the plane 151. Ions following trajectory path 169 may strike the substrate 102 at an angle of about −θ normal to the plane 151. Although non-limiting, the range of incident angles normal to the plane 151 may be between about +1° and about +89° and between about −1° and about −89°, excluding 0°. For example, a first range of incident angle normal to the plane 151 may be between about +30° and about +80° and a second range of incident angle may be between about −30° and about −80°. In one embodiment, the first range of incident angle relative to the plane 151 may be between about −40° and about −70° and the second range of incident angle relative to the plane 151 may be between about +40° and about +70°. In addition, some ion trajectories, such as paths 169 and 171, may cross one another.

Depending on a number of factors including, but not limited to, the positioning of the directional element 123, the horizontal spacing between the insulators 112, 114, the vertical spacing (Z) of the insulators 112, 114 above the plane 151, the dielectric constant of the directional element 123 and the insulators 112, 114 and other plasma processing parameters, the range of incident angle (θ) as described above, is between about +89° and about −89°, exclusive of 0°. Embodiments herein are not limited in this context, however.

Furthermore, the range of incident angle may be selected based upon an aspect ratio of a 3D feature on the substrate 102. For example, sidewalls 105, 107 of a fin structure 104 having one or more material film layers formed thereon, having an exaggerated size for clarity of illustration, may be more uniformly treated by the ions 121 than with conventional plasma processing apparatuses and procedures. For example, by utilizing a bimodal ion distribution, only desired areas of the features may be modified as a result of shadowing effects and the ion trajectory. The aspect ratio, which may be defined as the relationship between a pitch between the sidewalls 105, 107 and a height of the sidewalls 105, 107 extending from the substrate 102, may determine the trajectory at which the ions 121 are directed toward the fin structures 104. In one embodiment, the trajectory of the ions 121 and the incident angle relative to the plane 151 may be selected to avoid contact with material below the sidewalls 105 and 107, for example, the substrate 102 in one embodiment, or an insulator in another embodiment. It is also contemplated that different angle and ion trajectories may be selected for different orientations of features disposed on the substrate. For example, treatment of a fin structure and treatment of a gate structure may utilize the same or different ion trajectories, materials, dosages, etc.

The above-described processing apparatus 100A can be controlled by a processor-based system controller such as the controller 130, the support circuits 136, the CPU 132, and memory 134. For example, the controller 130 may be configured to control flow of various precursor and process gases from gas sources and control processing parameters associated with directional ion implantation processes.

As previously described, the plasma processing apparatus 100A is only one example of an apparatus that may be used. Other apparatus, such as pattern beams, electron beams (e.g., pulsed or continuous), raster scanning, and variable scanning apparatus may be used. Any other method of directionally implanting ions may also be used. According to certain aspects, one or more energetic particle beams may include a cylindrical shaped beam, a plurality of adjacent or overlapping cylindrical beams, or a ribbon shaped beam (e.g., a continuous rectangular shaped beam). The one or more energetic particle beams can be moved relative to the substrate 102 during processing and/or the substrate 102 can be moved relative to the energetic particle beam during processing. Different processing characteristics may be used, such as beam energy, beam angle, beam angle relative to the transfer direction of the substrate 102, and beam composition (e.g., gas ions), among other processing characteristics, may be utilized to implant one or more features or layers formed on the substrate 102.

Figure 2:
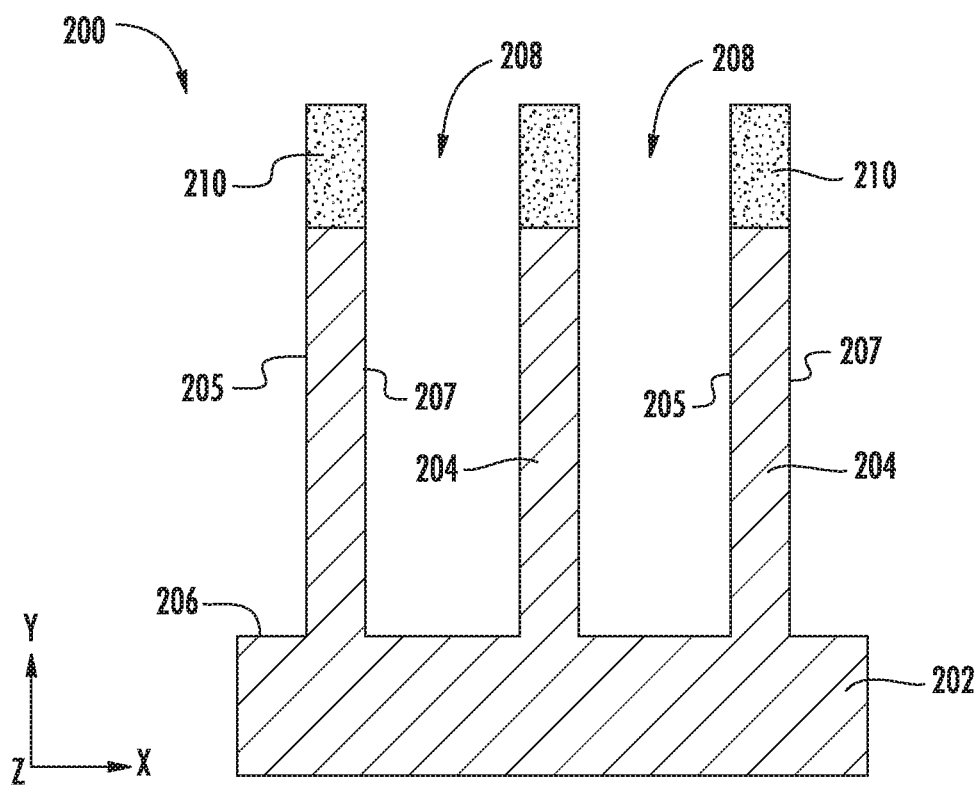
FIG. 2 is a side cross-sectional view of a finned substrate of a device according to embodiments of the present disclosure.

FIG. 2 depicts a perspective view of a semiconductor device (hereinafter "device") 200 in accordance with embodiments of the present disclosure. The device 200 may include a substrate 202 and a plurality of fins 204 extending from the substrate 202. As shown, each of the plurality of fins 204 extends approximately perpendicularly from a top surface 206 of the substrate 202. The plurality of fins 204 may constitute fin structures formed into fin-type field effect transistors (finFETs). Each of the plurality of fins 204 may include a first sidewall 205 parallel to a second sidewall 207. As shown, the plurality of fins 204 may include a hardmask layer 210, such as SiN, formed thereon.

The plurality of fins 204 may be semiconductor strips formed in the substrate 202. In some embodiments, the plurality of fins 204 may be formed in the substrate 202 by etching a plurality of trenches 208 therein. The etching may be any suitable etch process, such as a reactive ion etch (RIE), neutral beam etch (NBE), the like, or a combination thereof. The etch may be anisotropic.

As used herein, to provide spatial context, XYZ Cartesian coordinates are shown in figures. It is to be understood that the term "vertical" as used herein denotes a y-direction of the Cartesian coordinates shown in the figures, and that the terms "horizontal" or "lateral" as used herein denotes an x-direction of the Cartesian coordinates shown in the drawings, which is perpendicular to the y-direction.

Although non-limiting, the substrate 202 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 202 may have various dimensions, such as 200 mm, 300 mm, 450 mm or other diameter, as well as, being a rectangular or square panel. Unless otherwise noted, embodiments and examples described herein are conducted on substrates with a 200 mm diameter, a 300 mm diameter, or a 450 mm diameter substrate. In the embodiment wherein a SOI structure is utilized for the substrate 202, the substrate 202 may include a buried dielectric layer disposed on a crystalline silicon substrate. In the embodiment depicted herein, the substrate 202 may be a crystalline silicon substrate. Moreover, the substrate 202 is not limited to any particular size or shape. The substrate 202 may be a round substrate having a 200 mm diameter, a 300 mm diameter or other diameters, such as 450 mm, among others. The substrate may also be any polygonal, square, rectangular, curved or otherwise non-circular workpiece, such as a polygonal glass substrate used in the fabrication of flat panel displays.

Figure 3:
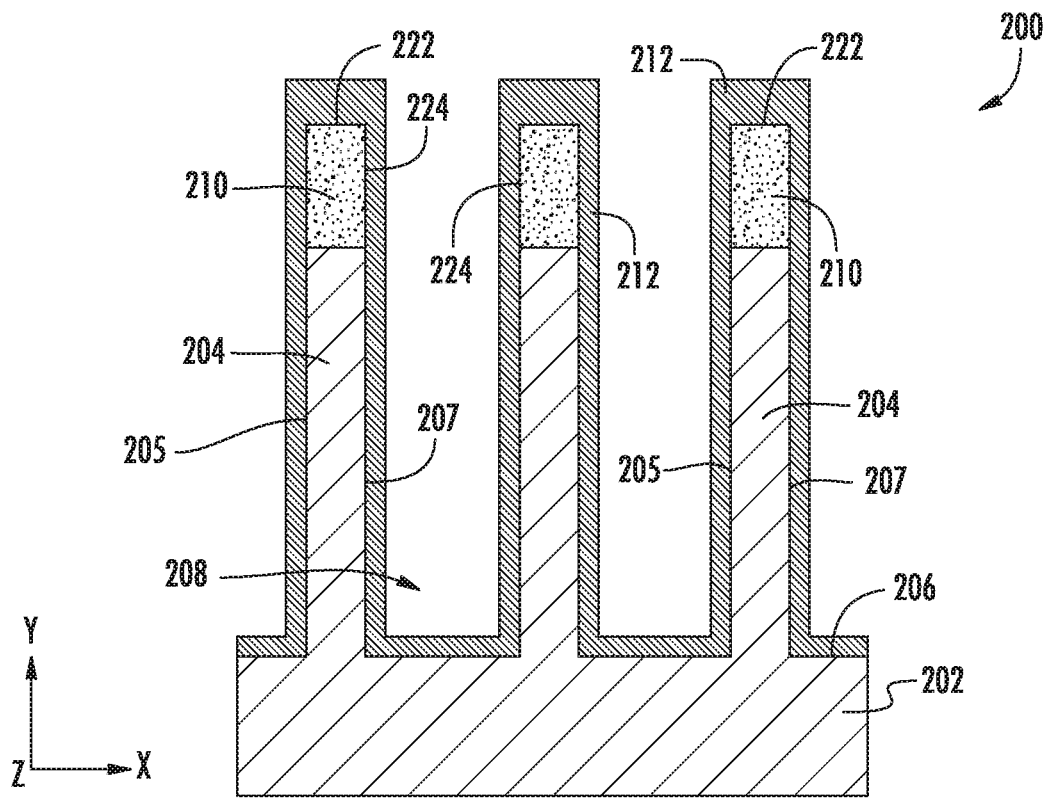
FIG. 3 is a side cross-sectional view of the device after deposition of a capping layer according to embodiments of the present disclosure.

As shown in FIG. 3, a capping layer 212 may be formed over the device 200, including over each of the plurality of fins 204 and the hardmask layer 210. The capping layer 212 may be further formed over the top surface 206 of the substrate 202 within each of the trenches 208. In some embodiments, the capping layer 212 may be SiN formed along the first sidewall 205 and the second sidewall 207 of each of the plurality of fins 204. As shown, the capping layer 212 may also be formed over a top surface 222 and a set of sidewalls 224 of the hardmask layer 110.

Figure 4:
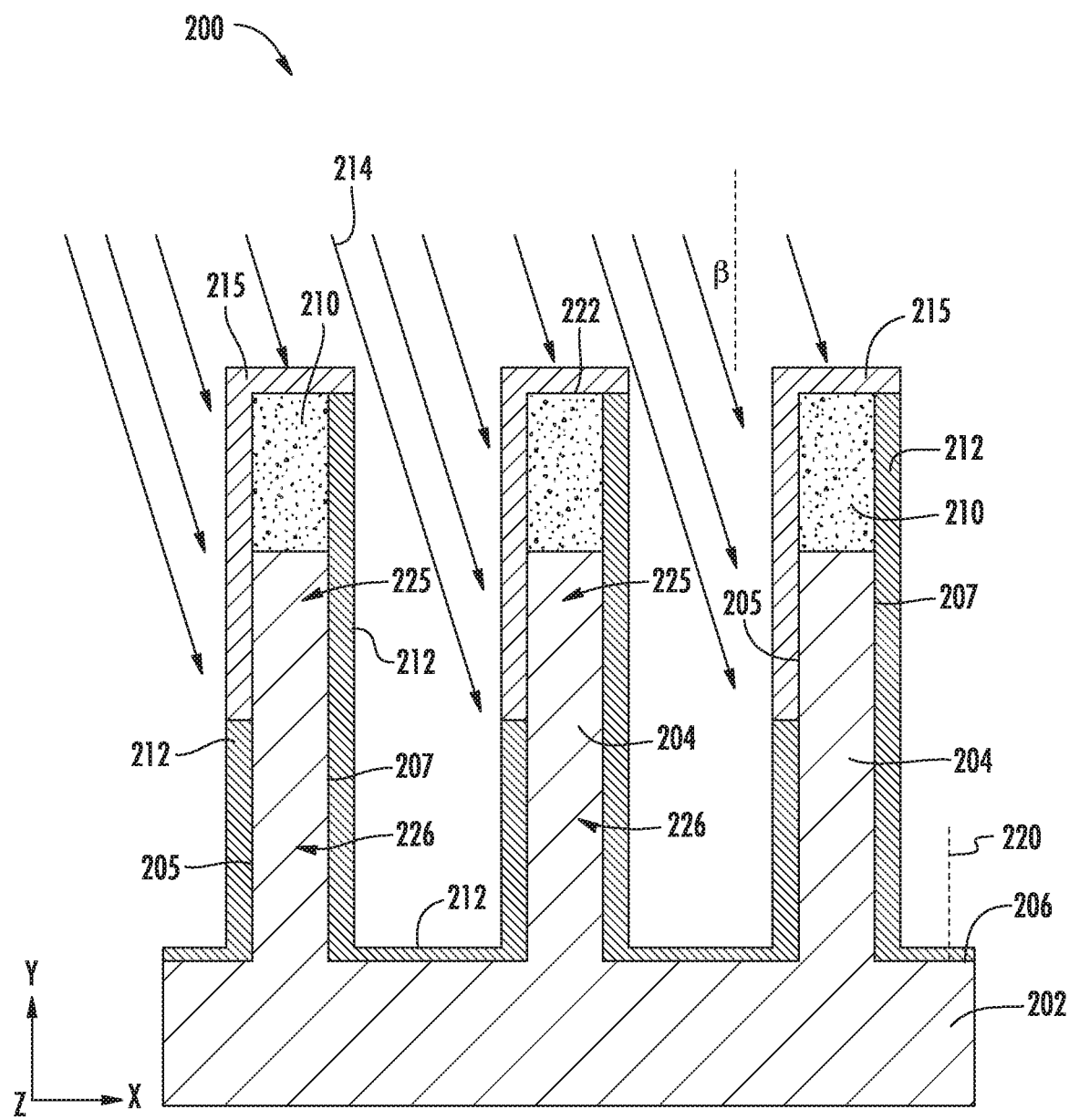
FIG. 4 is a side cross-sectional view of the device during an optional ion assisted directional plasma treatment according to embodiments of the present disclosure.

As shown in FIG. 4, the device 200 may optionally receive an ion assisted directional plasma treatment (PME) 214 to sequentially or simultaneously treat a portion 215 of the capping layer 212 along the first sidewall 205 of each of the plurality of fins 204 and along the top surface 222 of the hardmask layer 210. The PME 214 may be delivered at one or more selected angles of inclination (β), relative to a perpendicular 220 to the top surface 206 of the substrate 202, into the desired region(s) of the capping layer 212. In this embodiment, the second sidewall 207 of the fins 204 is not impacted by the PME 214. Furthermore, angle β may be selected so the PME 214 impacts an upper section 225 of the fins 204 but does not impact a lower section 226 of the fins 204. Although non-limiting, the upper section 225 of the fins 204 may generally correspond to an upper half of the fins 204, while the lower section 226 may generally correspond to a lower half of the fins 204. As shown, by providing the PME 214 at the angle of inclination β, the capping layer 212 along the top surface 206 of the substrate 202 is not impacted.

The ions of the PME 214 may modify surface properties of the portion 215 of the capping layer 212. For example, the PME 214 may increase an etch rate of the portion 215 of the capping layer 212 during a subsequent etch process. It will be appreciated that the degree to which the physical or chemical composition of the portion 215 of the capping layer 212 is modified may be determined by one or more variables, including the species of ion selected, the material properties of the capping layer 212 being modified, the rotational orientation of the substrate 202, the temperature at which the ions are implanted, the concentration and/or dosage of the ion being implanted, and the amount of energy with which the ions are implanted in capping layer 212.

Figure 5:
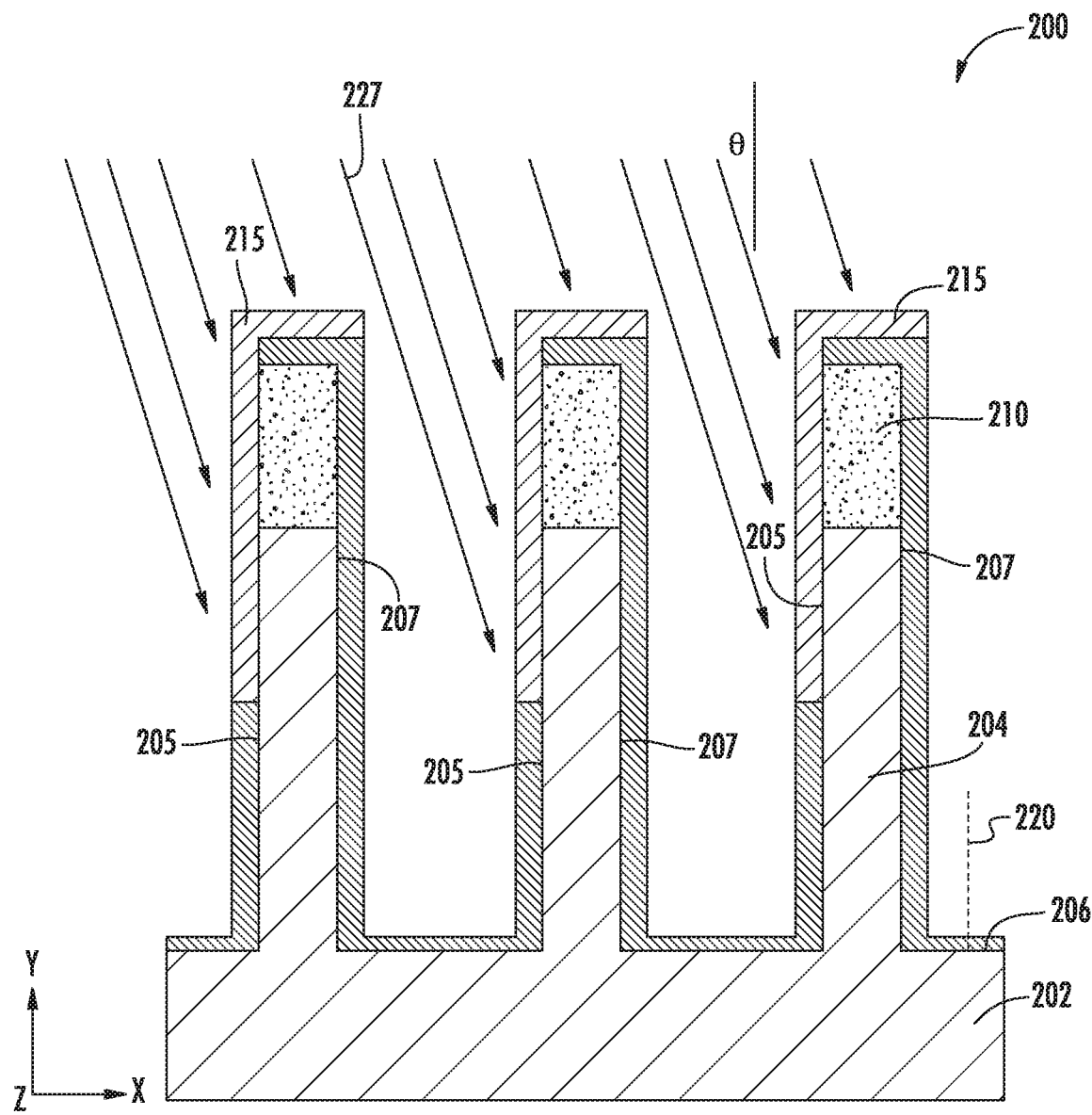
FIG. 5 is a side cross-sectional view of the device during an etch process according to embodiments of the present disclosure.

FIG. 5 demonstrates an etch process 227 performed to the portion 215 of the capping layer 212, e.g., along the first sidewall 205 of the fins 204. In some embodiments, the etch process 227 may be an RIE delivered at a non-zero angle of inclination (θ) relative to the perpendicular 220 extending from the top surface 206 of the substrate 202. Non-zero angle of inclination θ may be selected so the etch process 227 impacts the upper section 225 of the fins 204 but does not impact the lower section 226 of the fins 204. As shown, providing the etch process 227 at the angle of inclination θ prevents the capping layer 212 along the top surface 206 of the substrate 202 from being impacted. In various non-limiting embodiments, the non-zero angle of inclination θ of the angled ion etch process 227 may be the same or different than the non-zero angle of inclination β of the PME 214 shown in FIG. 4. In some embodiments, the PME 214 is not performed and, instead, the etch process 227 is performed directly following the deposition of the capping layer 212 to remove the portion 215.

Figure 6:
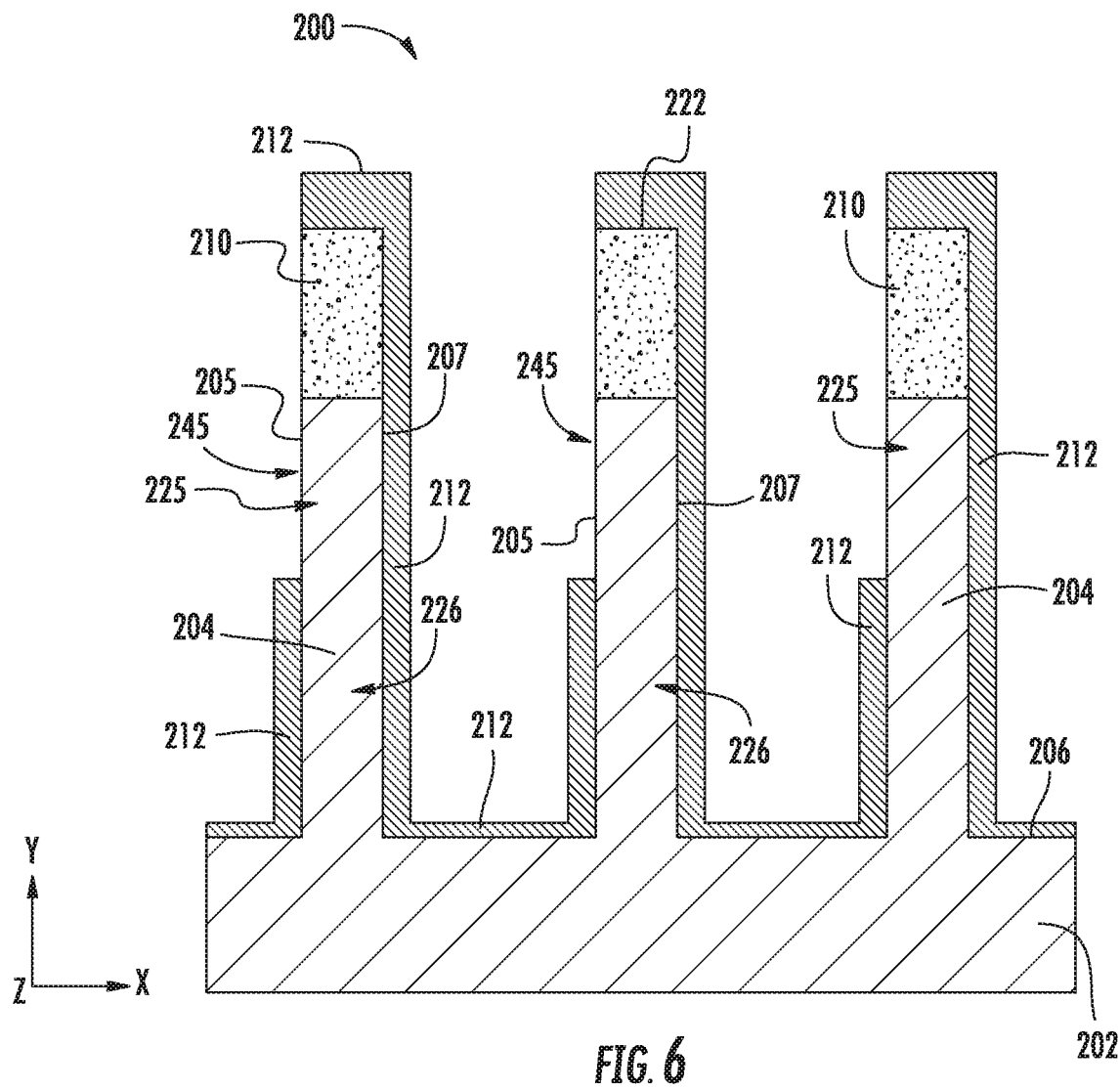
FIG. 6 is a side cross-sectional view of the device following removal of a portion of the capping layer as a result of the etch process according to embodiments of the present disclosure.

As a result of the etch process 227, the portion 215 of the capping layer 212 may be removed from the fins 204, as demonstrated in FIG. 6. In some embodiments, the capping layer 212 may be removed selective to the first sidewall 205 of the fins 204, along the upper section 225 thereof. That is, the etch process 227 may expose just a target area 245 of the first sidewall 205. As shown, the second sidewall 207 and the top surface 222 of the hardmask layer 210 may remain covered by the capping layer 212. Furthermore, the lower section 226 of each of the fins 204 and the top surface 206 of the substrate 202 may also remain covered by the capping layer 212 following the etch process 227.

Figure 7:
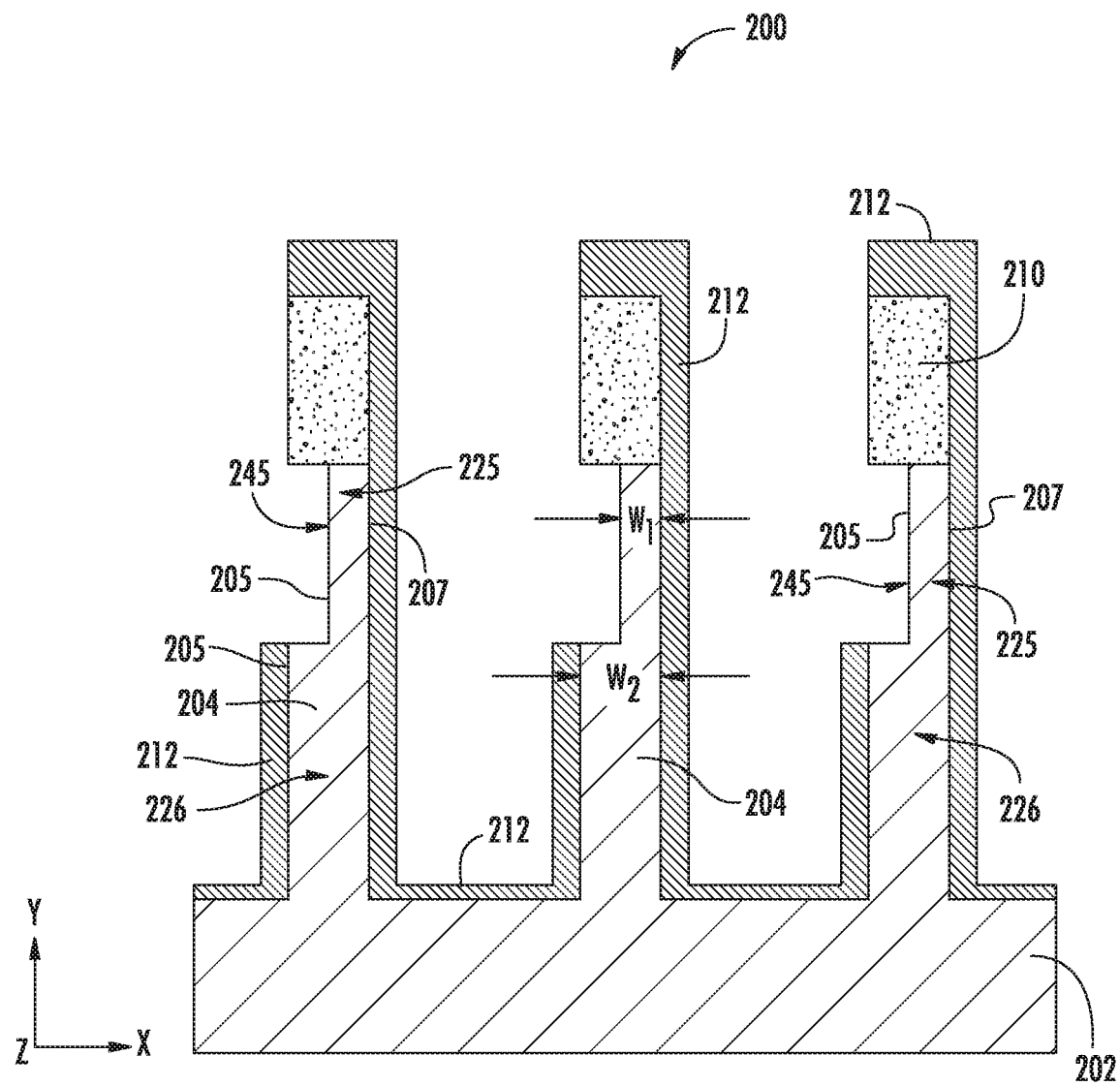
FIG. 7 is a side cross-sectional view of the device following a fin trimming process according to embodiments of the present disclosure.

As shown in FIG. 7, the target area 245 of the first sidewall 205 of the fins 204 may be trimmed to reduce a lateral width (e.g., along the x-direction) of the upper section 225 of the fins 204. In some embodiments, the target area 245 of the first sidewall 205 may be trimmed using an isotropic Si etch process. As shown, the etch will only affect the exposed target area 245 of the first sidewall 205 of the fins 204. Due to the presence of the capping layer 212, the isotropic etch generally does not impact the lower section 226 of the fins 204. After the fin trimming process, the upper section 225 of the fins 204 may have a first width 'W1', while the lower section 226 of the fins 204 may have a second width 'W2'. As shown, W2>W1. It will be appreciated that the isotropic etch only trims either the first sidewall 205 or the second sidewall 207. In this case, the second sidewall 207 is not affected.

In some embodiments, the fin trimming may be carried out using an isotropic wet etching process, or an oxidation/oxide strip process. For instance, the fins 204 can be oxidized (e.g., using a thermal oxidation process) and the oxide stripped to trim the fins 204. This oxidation/oxide strip process can be repeated multiple times until a desired fin width is achieved.

Figure 8:
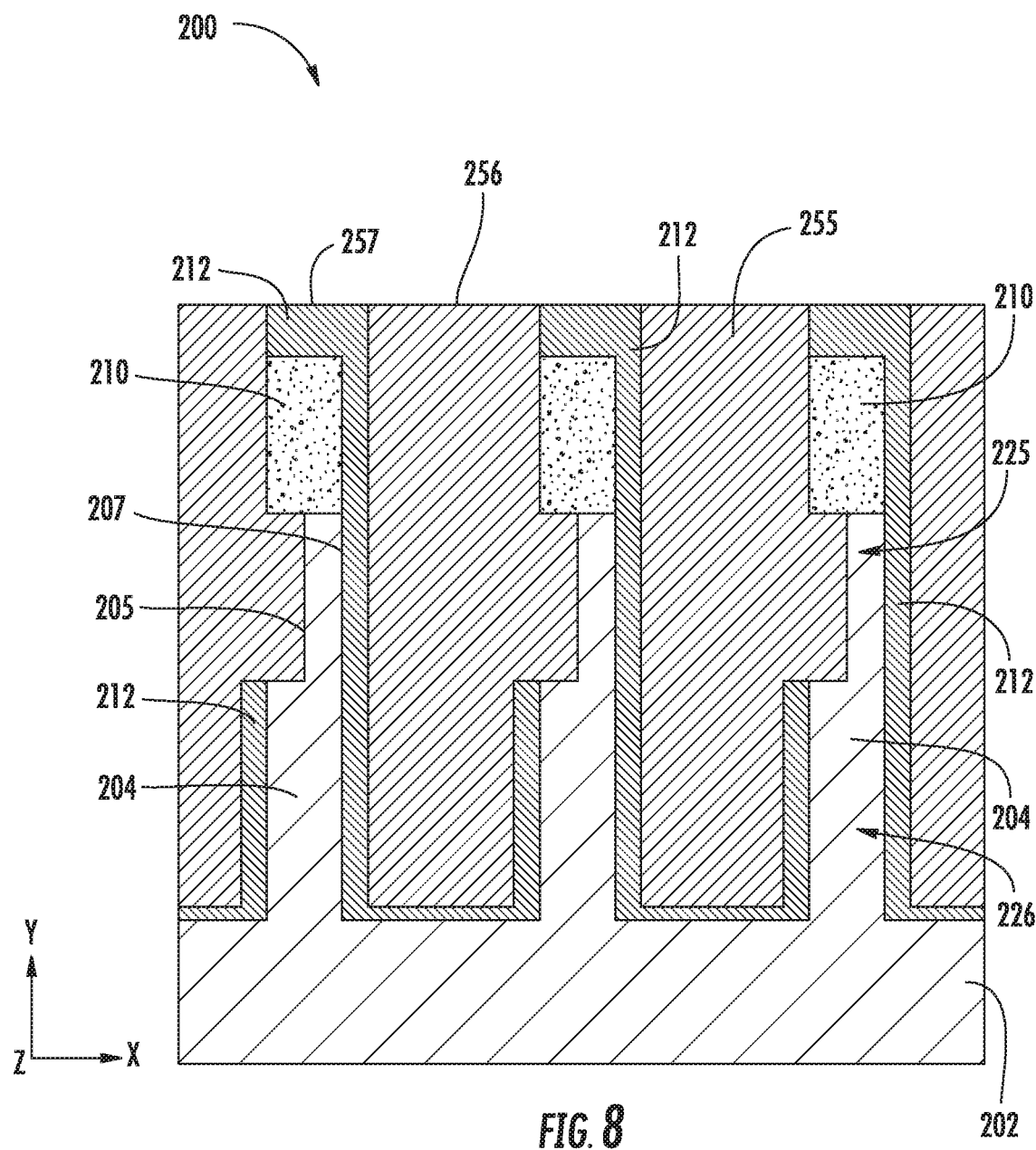
FIG. 8 is a side cross-sectional view of the device following a deposition of an STI material according to embodiments of the present disclosure.

FIG. 8 depicts the device 200 following formation of a source trench isolation (STI) material 255 in accordance with embodiments of the present disclosure. The STI material 255 may be an insulation material formed over the device 200, including between neighboring fins of the plurality of fins 104, to form isolation regions. Although non-limiting, the insulation material of the STI material 255 may be an oxide, such as silicon oxide, a nitride, the like, or a combination thereof. The insulation material may be formed by a high density plasma chemical vapor deposition (HDP-CVD), a flowable CVD (FCVD) (e.g., a CVD-based material deposition in a remote plasma system and post curing to convert to another material, such as an oxide), the like, or a combination thereof. Other insulation materials formed by any acceptable process may be used.

In the illustrated embodiment, the insulation material of the STI material 255 may be silicon oxide formed by a FCVD process. An anneal process may be performed once the insulation material is formed. In some embodiments, a planarization process, such as a chemical mechanical polish (CMP), may remove any excess insulation material and form a top surface 256 of the STI material 255. The top surface 256 of the STI material 255 may be level or planar with a top surface 257 of the capping layer 212 over the hardmask layer 210 of the fins 204.

Figure 9:
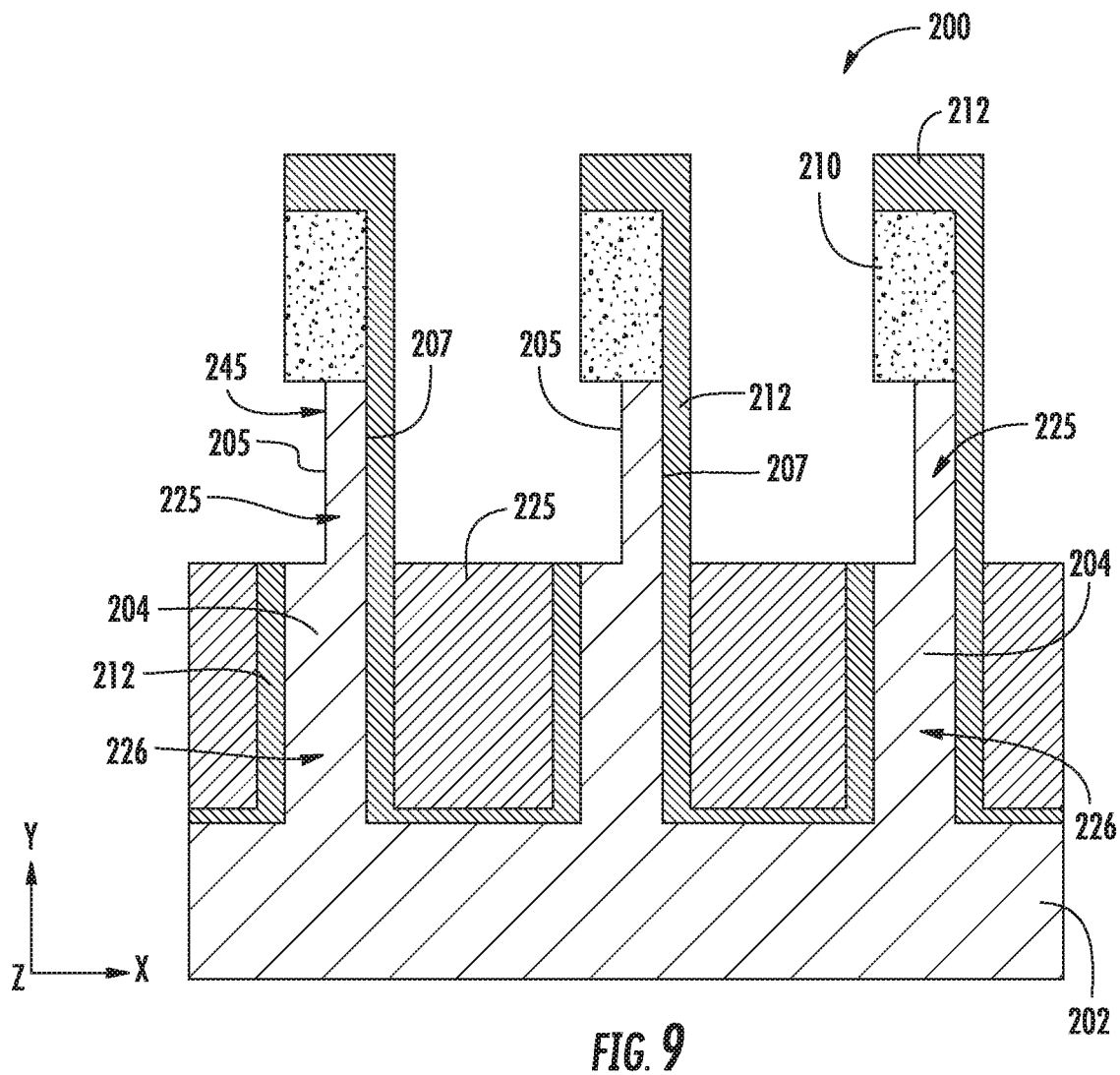
FIG. 9 is a side cross-sectional view of the device after the STI material is recessed according to embodiments of the present disclosure.

As shown in FIG. 9, the STI material 255 may be removed/recessed to expose just the upper section 225 of the plurality of fins 204 along the first sidewall 205. As shown, the STI material 255 may be removed selective to the target area 245 of the first sidewall 205 of the fins 204 and to the capping layer 212 extending along the upper section 225 of the fins and the hardmask layer 210. In some embodiments, the lower section 226 of the plurality of fins 204 remains covered by the STI material 255 and by the capping layer 212. In some embodiments, the STI material 255 may be removed using an acceptable etch process, such as a reactive ion etch (RIE), neutral beam etch (NBE), or a combination thereof. The etch may be anisotropic.

Figure 10:
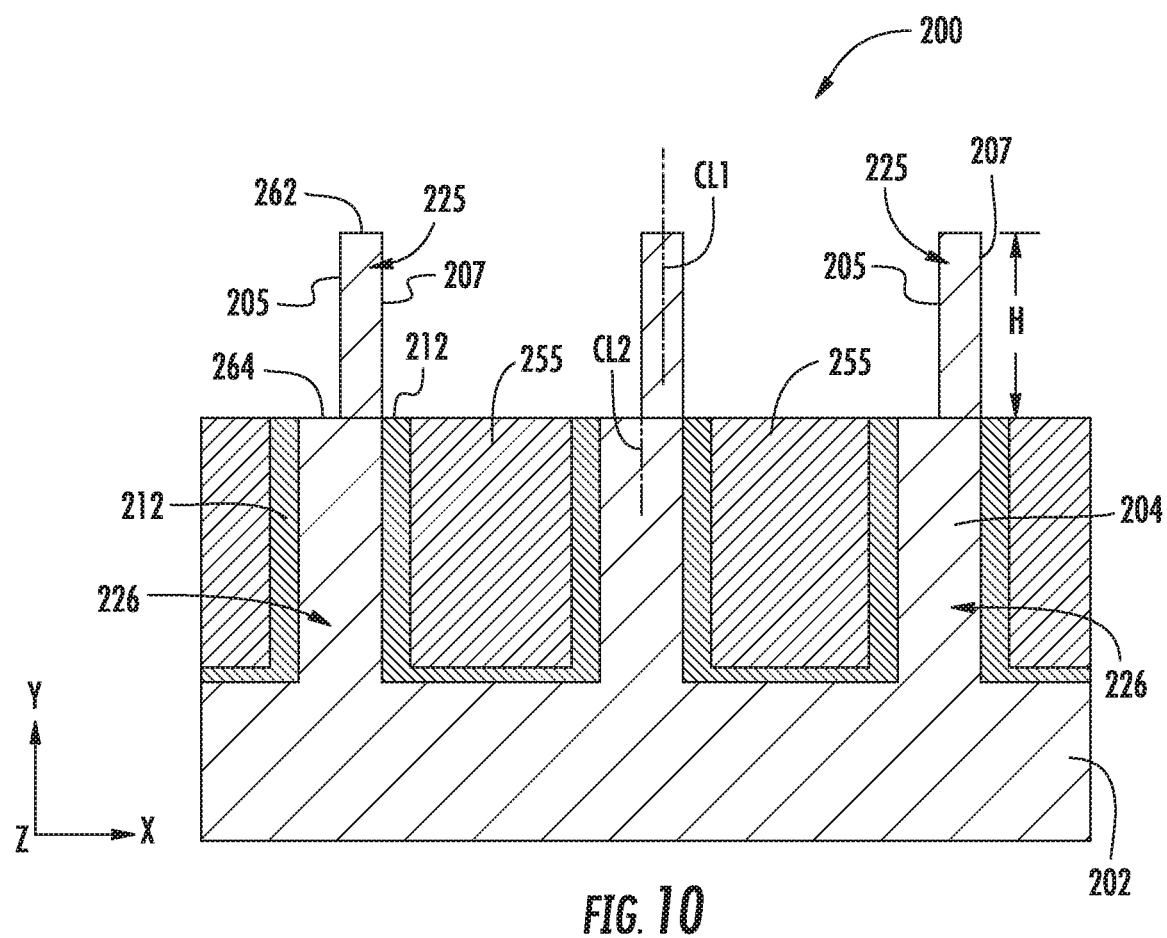
FIG. 10 is a side cross-sectional view of the device after removal of a hardmask layer and a portion of the capping layer according to embodiments of the present disclosure.

As shown in FIG. 10, the hardmask layer 210 and a portion of the capping layer 212 left uncovered by the STI material 255 are then removed. In some embodiments, the capping layer 212 is removed from the second sidewall 207 of the upper section 225 of the fins 204, e.g., selective to the Si of the fins 204. The capping layer 212 remains along the lower section 226 of the fins 204. Removal of the hardmask layer 210 further exposes a top surface 262 of each of the fins 204.

In some embodiments, the second sidewall 207 along the upper section 225 of each fin 204 is generally coplanar with the second sidewall 207 along the lower section 226 of each fin 204. Meanwhile, the first sidewall 205 along the upper section 225 of each fin 204 is parallel, but non-coplanar, with the second sidewall 207 along the lower section 226 of each fin 204. As such, a vertical centerline 'CL1' the upper section 225 is offset (e.g., along the x-direction) relative to a second vertical centerline 'CL2' of the lower section 226, resulting in a horizontal shelf 264, which is coplanar with the top surface 256 of the STI material 255. By performing fin trimming along only one side of each fin 204, a reduced thickness active fin may be achieved without the extra processing step(s) of trimming from both sides.

Furthermore, as shown, the first and second sidewalls 205, 207 along the upper section 225 of each fin 204 are parallel with one another along an entire height 'H' thereof. Said differently, the upper section 225 of each fin 204 has a constant lateral width from the horizontal shelf 264 to the top surface 262 of each of the fins 204. The lower section 226 of each of the fins 204 may also have a constant width. In other embodiments, the width of the lower section 226 of one or more of the fins 204 varies.

In sum, embodiments described herein provide approaches for performing fin trimming before STI formation, which advantageously provides a novel asymmetrical fin profile having a uniform height and width across the active fins. By avoiding active fins having a wider base and/or unequal heights, electrical properties of FinFET devices can be enhanced while at the same time decreasing DIBL.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the device 200, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
   providing a substrate within a process chamber, the substrate including a plurality of fins;
   forming a capping layer over the plurality of fins, wherein the capping layer extends along a first sidewall and a second sidewall of each of the plurality of fins;
   removing just a portion of the capping layer from the first sidewall along an upper section of each of the plurality of fins to expose a target area of the first sidewall of each of the plurality of fins, wherein the capping layer remains along an entire height of the second sidewall of each of the plurality of fins; and
   trimming the target area of the first sidewall of each of the plurality of fins to reduce a lateral width of the upper section of each of the plurality of fins.

2. The method of claim 1, further comprising forming a source trench isolation (STI) material over the substrate and the plurality of fins.

3. The method of claim 2, further comprising:
   recessing the STI material; and
   removing the capping layer from the second sidewall of the upper section of each of the plurality of fins.

4. The method of claim 3, wherein the capping layer remains along a lower section of each of the plurality of fins after the capping layer is removed from the second sidewall of the upper section of each of the plurality of fins.

5. The method of claim 4, further comprising reducing the lateral width of each of the plurality of fins along just the upper section, wherein the lateral width of each of the plurality of fins along the lower section is unchanged, and wherein the first sidewall and the second sidewall of the upper section are parallel to one another.

6. The method of claim 1, wherein removing the portion of the capping layer comprises etching the capping layer selective to the first sidewall of each of the plurality of fins.

7. The method of claim 6, further comprising etching the portion of the capping layer using a reactive ion etch delivered at a non-zero angle of inclination relative to a perpendicular to a plane defined by a top surface of the substrate.

8. The method of claim 6, further comprising performing an ion implant to the portion of the capping layer prior to etching the portion of the capping layer.

9. The method of claim 1, wherein reducing the lateral width of the upper section of each of the plurality of fins further results in a first vertical centerline of the upper section being horizontally offset relative to a second vertical centerline of the lower section.

10. A method of forming a finFET device, comprising:
    providing a plurality of fins extending from a substrate;
    forming a capping layer over the plurality of fins and the substrate, wherein the capping layer extends along a first sidewall and a second sidewall of each of the plurality of fins;
    removing just a portion of the capping layer from the first sidewall along an upper section of each of the plurality of fins to expose a target area of the first sidewall of each of the plurality of fins, wherein the capping layer remains along an entire height of the second sidewall of each of the plurality of fins; and
    reducing a lateral width of the upper section of each of the plurality of fins by trimming the target area of the first sidewall of each of the plurality of fins.

11. The method of claim 10, further comprising:
    forming a source trench isolation (STI) material over the substrate and the plurality of fins;
    recessing the STI material; and
    removing the capping layer from the second sidewall of the upper section of each of the plurality of fins, wherein the capping layer remains along a lower section of each of the plurality of fins.

12. The method of claim 10, further comprising reducing the lateral width of each of the plurality of fins along just the upper section without reducing the lateral width of each of the plurality of fins along the lower section, and wherein the first sidewall and the second sidewall of the upper section are parallel to one another along an entire height of the upper section.

13. The method of claim 10, wherein removing the portion of the capping layer comprises etching the capping layer, selective to the first sidewall of each of the plurality of fins, using a reactive ion etch delivered at a non-zero angle of inclination relative to a perpendicular to a plane defined by a top surface of the substrate.

14. The method of claim 10, further comprising performing an ion implant to the portion of the capping layer prior to removing the portion of the capping layer.

* * * * *